(12) United States Patent
Kmiecik et al.

(10) Patent No.: US 8,847,982 B2
(45) Date of Patent: Sep. 30, 2014

(54) METHOD AND APPARATUS FOR GENERATING AN ORTHORECTIFIED TILE

(75) Inventors: Marcin Michal Kmiecik, Lodz (PL); Wojciech Tomasz Nowak, Konstantynow Lodzki (PL)

(73) Assignee: TomTom Global Content B.V., Eindhoven (NL)

( * ) Notice: Subject to any disclaimer, the term of this patent is extended or adjusted under 35 U.S.C. 154(b) by 413 days.

(21) Appl. No.: 12/311,467

(22) PCT Filed: Oct. 9, 2007

(86) PCT No.: PCT/NL2007/050489
§ 371 (c)(1),
(2), (4) Date: Dec. 16, 2009

(87) PCT Pub. No.: WO2008/044927
PCT Pub. Date: Apr. 17, 2008

(65) Prior Publication Data
US 2010/0091017 A1 Apr. 15, 2010

(30) Foreign Application Priority Data
Oct. 9, 2006 (WO) ................ PCT/NL2006/050252

(51) Int. Cl.
| | |
|---|---|
| *G09G 5/00* | (2006.01) |
| *G09B 29/10* | (2006.01) |
| *G06T 3/00* | (2006.01) |
| *G11C 11/02* | (2006.01) |
| *G06T 5/00* | (2006.01) |
| *G06T 3/40* | (2006.01) |

(52) U.S. Cl.
CPC ............... *G06T 3/00* (2013.01); *G09B 29/102* (2013.01); *G11C 11/02* (2013.01); *G11C 21/32* (2013.01); *G06T 5/006* (2013.01); *G06T 3/4038* (2013.01)
USPC ............................ 345/629; 345/420; 348/148

(58) Field of Classification Search
CPC .................................. G01C 11/02; B60R 1/00
USPC .................................. 345/629, 420; 348/148
See application file for complete search history.

(56) References Cited

U.S. PATENT DOCUMENTS

| 5,517,419 A | 5/1996 | Lanckton et al. | |
|---|---|---|---|
| 7,072,764 B2 * | 7/2006 | Donath et al. ................ | 701/200 |

(Continued)

FOREIGN PATENT DOCUMENTS

| CN | 1701213 | 11/2005 |
|---|---|---|
| EP | 1 473 673 | 11/2004 |

(Continued)

OTHER PUBLICATIONS

Kim, G.-H., Sohn, H.-G. and Song, Y.-S. (2006), "Road Infrastructure Data Acquisition Using a Vehicle-Based Mobile Mapping System;" Computer-Aided Civil and Infrastructure Engineering, 21: 346-356. doi: 10.1111/j.1467-8667.2006.00441.x.*

(Continued)

*Primary Examiner* — Kee M Tung
*Assistant Examiner* — Peter Hoang

(57) ABSTRACT

A method is disclosed for generating an orthorectified tile. In at least one embodiment, the method includes retrieving source images obtained by way of a terrestrial based camera; retrieving position data associated with the source images; retrieving orientation data associated with the source images; and converting source image by means of corresponding position data and orientation data to obtain the orthorectified tile. Orthorectified tiles are used to generate an orthorectified mosaic. As such, images recorded by terrestrial based camera may be used to generate a map of a road surface with corresponding road signs.

16 Claims, 9 Drawing Sheets

(56) References Cited

U.S. PATENT DOCUMENTS

| | | | |
|---|---|---|---|
| 7,511,734 B2* | 3/2009 | Ozaki | 348/148 |
| 2004/0264761 A1* | 12/2004 | Mas et al. | 382/154 |
| 2005/0237385 A1 | 10/2005 | Kosaka et al. | |
| 2006/0209057 A1* | 9/2006 | Damera-Venkata et al. | 345/204 |

FOREIGN PATENT DOCUMENTS

| EP | 1623875 A1 | 2/2006 |
|---|---|---|
| JP | 2006507483 A | 3/2006 |

OTHER PUBLICATIONS

Guangping He et al, Capturing Road Network Data Using Mobile Mapping Technology, International Achieves of Photogrammetry and Remote Sensing. vol. XXXIII, Part B2. Amsterdam 2000.
International Search report issued Jan. 6, 2007 for International Application No. PCT/NL2006/050252.
International Search report issued Dec. 18, 2007 for International Application No. PCT/NL2007/050489.

* cited by examiner

METHOD AND APPARATUS FOR GENERATING AN ORTHORECTIFIED TILE

FIELD OF THE INVENTION

The present invention relates to a method for generating an orthorectified tile. The invention further relates to a processor readable storage medium carrying an orthorectified tile, a computer arrangement for generating an orthorectified tile. Furthermore, the invention relates to a method of collecting both positionally accurate horizontal information and positionally accurate vertical information from source images of at least one terrestrial based image sequence captured by a terrestrial based camera and a method of collecting both positionally accurate horizontal information and positionally accurate object information from at least one source image obtained by a terrestrial based camera, wherein the object is visibly attached to the ground

PRIOR ART

There is a need to collect a large number of horizontal road information e.g. lane dividers, road centrelines etc. for digital map databases used in navigation systems and the like. This information could be obtained by interpreting high resolution aerial orthorectified images. An orthorectified image is a "scale corrected" image, depicting ground features as seen from above in their exact ground positions, in which distortion caused by camera and flight characteristics and relief displacement has been removed using photogrammetric techniques. An orthorectified image is a kind of aerial photograph that has been geometrically corrected ("orthorectified") such that the scale of the photograph is uniform, meaning that the photograph can be considered equivalent to a map. An orthorectified image can be used to measure true distances, because it is an accurate representation of the earth's surface, having been adjusted for topographic relief, lens distortion, and camera tilt. Orthorectified views differ from perspective views in that orthorectified views project at a right angle to a reference plane, whereas perspective views project from the surface onto the reference plane from a single fixed position or viewpoint. An orthorectified image can be obtained by any suitable map projection. The map projection can be a projection by surface, such as cylindrical, pseudocylindrical, hybrid, conical, pseudoconical or azimuthal. The projection can also be a projection by preservation of a metric property. The map projections have in common that they are orthogonal projections, which means that every pixel represents a point on the surface of the reference plane (ellipsoid that approximates the shape of the earth) seen along a line perpendicular to that surface. Thus, every pixel of an orthorectified image of the earth surface substantially corresponds to a view of the earth surface seen along a line perpendicular to the ellipsoid that approximates the shape of the earth.

In addition to the projection constraints above, an orthorectified image comprises metadata enabling an algorithm to reference any pixel of the orthorectified image to a point in the geographic coordinate reference system. As the exact position on the ellipsoid that approximates the shape of the earth of each pixel is known, the position and size of ground features, e.g. horizontal road information, can be retrieved from an orthorectified image and highly accurate distances and earth coordinates can be computed. The metadata of a geocoded orthorectified image defines the projected coordinate reference system to determine for each pixel the corresponding position in that geographic coordinate reference system. Such high resolution orthorectified images should have a pixel size below 25 cm. To obtain such images with aerial or satellite photography is very expensive and there is no guarantee that all the road horizontal information is captured.

Orthorectified images can be obtained very efficiently from aerial images. However, errors are often introduced, which can result in inaccurate mapping of the geo-position data. The main problem is that normally aerial images are not taken exactly perpendicular to the surface of the earth. Even when a picture is taken close to that it is only the center of the picture that is exactly perpendicular. In order to orthorectify such an image, height-of-terrain information must be additionally obtained. The lack of accurate height information of objects in an aerial image, in combination with the triangulation process used to determine the orthorectified image, can result in an inaccuracy of such images up to a dozen of meters. The accuracy can be improved by taking overlapping images and comparing the same surface obtained from subsequent images from the same aerial camera. But still, there is a limit to the accuracy obtained vs. the cost.

Furthermore, there is a need to collect "vertical" road information, e.g. speed limits, directions signposts etc. for digital map databases used in navigation systems and the like. In this application, the term "horizontal" data or information corresponds to objects that have a surface parallel to the earth surface. The term "vertical" data or information corresponds to objects positioned on the earth surface and that can be seen with a looking axis parallel to the earth surface. Vertical road information cannot be obtained from typical lookdown aerial or satellite images. Nowadays, vertical road information can be obtained by analysing and interpreting horizontal picture images and other data collected by a mobile collection device. Mobile mapping vehicles which are terrestrial based vehicles, such as a car or van, are used to collect mobile data for enhancement of digital map databases. Examples of enhancements are the location of traffic signs, route signs, traffic lights, street signs showing the name of the street etc.

The mobile mapping vehicles have a number of cameras, possibly some of them stereographic and all of them are accurately geo-positioned as a result of the van having precision GPS and other position and orientation determination equipment (e.g. Inertial Navigation System—INS) onboard. While driving the road network, geo-coded image sequences are being captured. Geo-coded means that a position, computed by the GPS receiver and possibly INS, and possibly heading associated with the image is attached to the metadata of an image.

The mobile mapping vehicles record more then one image sequence of the object, e.g. a building or road surface, and for each image of an image sequence the geo-position in a geographic coordinate reference system is accurately determined together with the position and orientation data of the image sequence with respect to said geo-position. Image sequences with corresponding geo-position information will be referred to as geo-coded image sequences. Other data may also be collected by other sensors, simultaneously and similarly geocoded.

If in a digital map database both horizontal and vertical data are needed to support navigation applications or the like, the geo-positions related to said data should be accurate. However, the determined geo-positions corresponding to horizontal data obtained from aerial images do not always match the determined geo-positions corresponding to vertical data obtained from mobile data images. The interpreted geo-positions differ as two different data sources have been used, which are both analysed and interpreted by different tools. This can result in the incorrect placement or interpretation of data if information from both data sources are to be integrated into the same digital map database. Additionally, this will result in confusing situations if both horizontal and vertical data are displayed simultaneously in a navigation system or the like. Furthermore, the use of two types of data sources influences the production costs of a digital map database negatively.

Orthorectified images enable us to enrich the functionalities of navigation systems. From orthorectified images the dimensions and geo-position of a road and corresponding lanes can be determined accurately. The key is to generate databases for navigation systems in a cost effective way. The use of orthorectified images can promote safety and protect a vehicle and its passengers from undesirable events, such as driving in the wrong lane or going off the road. By combining the GPS position of the vehicle and the geo-positions of the road surface, the position of the vehicle with respect to the road surface can be determined and the driver can be informed as soon as he comes near to the road or lane boundary or when he is driving in the wrong lane.

DEFINITIONS

Coordinate: one of a sequence of n numbers designating the position of a point in n-dimensional space;
Coordinate conversion: change of coordinates, based on a one-to-one relationship, from one coordinate reference system to another based on the same datum;
Coordinate reference system: coordinate system which is related to the real world by a datum;
Coordinate system: set of mathematical rules for specifying how coordinates are to be assigned to points;
Datum: parameter or set of parameters that define the position of the origin, the scale, and the orientation of a coordinate reference system;
Ellipsoidal coordinate system (geodetic coordinate system): coordinate system in which position is specified by geodetic latitude, geodetic longitude and (in three-dimensional case) ellipsoidal height, associated with one or more geographic coordinate reference systems;
Geographic coordinate reference system: coordinate reference system using an ellipsoidal coordinate system and based on an ellipsoid that approximates the shape of the earth;
Map Projection: coordinate conversion from an ellipsoidal coordinate system to a plane;
Orthorectified view: view of a point from a chosen reference surface along a line perpendicular to that surface in said point;
Projected coordinate reference system: coordinate reference system derived from a two-dimensional geographic coordinate reference system by applying a map projection and using a Cartesian coordinate system.

SUMMARY OF THE INVENTION

The present invention seeks to provide an improved method to generate an orthorectified tile.

According to the present invention, the method comprises:
retrieving a sequence of source images obtained by means of a terrestrial based camera;
retrieving position data associated with the source images, wherein the position data include constant position parameters defining a relationship with the position of the camera on the vehicle and a predefined location of the moving vehicle and variable position parameters in a geographic coordinate reference system corresponding to an actual location of the predefined location;
retrieving orientation data associated with the source images, wherein the orientation data includes constant orientation parameters having a relationship with the orientation of the camera with respect to a reference orientation of the vehicle and variable orientation parameters in said geographic coordinate reference system corresponding to the orientation of the reference orientation of the vehicle in said coordinate reference system;
converting a source image by means of the corresponding position data and orientation data to obtain the orthorectified tile and corresponding metadata defining the conversion of pixel coordinates in the orthorectified image to a position in the geographic coordinate reference system;

The invention is based on the recognition that a mobile mapping vehicle which drives on the surface of the earth, records surface collected geo-position image sequences with terrestrial based cameras. Some of said image sequences include the road in front of the vehicle. Generally, the driving direction of the vehicle is substantially parallel to the surface of the road in front of the vehicle. Furthermore, the position and orientation of the camera with respect to the vehicle and thus with respect to the road surface is known. The position and orientation of the vehicle is determined by means of a GPS receiver and inertial measuring device, such as a gyroscope. All the position and orientation information enables us to convert by means of trigonometry the source images into an orthorectified tile representing a view that accurately approximates an orthorectified view. An orthorectified view according to the invention corresponds to a view from above with a looking axis which is perpendicular to a predefined plane or surface. The orthorectified tile is an image in which every point in the image is as if it is being viewed from directly above.

As the distance between the terrestrial based camera and the recorded road surface is limited and the geo-position of the camera is accurately known by means of an onboard positioning system (e.g. a GPS based receiver) and possibly additional position and orientation determination equipment, the geo-position of each orthorectified tile can accurately be determined. These orthorectified tiles enable us to obtain an accurate geo-positioned orthorectified mosaic of a road segment by superposing the orthorectified tiles on the basis of the corresponding geo-positions stored in the metadata. The orthorectified mosaic of the present invention enables us to capture horizontal road information which could not be captured from one single orthorectified tile, such as the number of lanes of a high way or width of the respective lanes. This reduces the costs of interpretation of individual source images and reduces the possibility of confusion because of differential errors between sources. Among the road information that can easily be interpreted is; lane information, road signage (location and attribution), lane connectivity attributes as well as road centerlines.

In a further embodiment, the method further comprises:
estimating a plane corresponding to the earth surface in dependence of the position and orientation data associated with the source images; and
converting uses the plane to convert a source image to obtain the orthorectified tile. The position and orientation data enables us to determine the position and orientation of the road surface below the vehicle. This enables us to estimate the plane of the road surface seen in a source image. As the slope of the road changes gradually, the plane of the road surface below the vehicle can be used as an approximation of the road surface in front of the vehicle seen in a source image. The sequence of source images and associated position and orientation data enables us to select position and orientation data associated with source images captured when the vehicle is positioned at the road surface seen in a previously captured source image. In this way, the position and orientation of a road surface seen in a source image can be accurately estimated, enabling us to improve the accuracy of the orthorectified tile.

In a further embodiment of the invention an orthorectified tile corresponds to a predefined horizontal area having a predefined position with respect to the terrestrial based camera or mobile mapping vehicle. This feature enables us to restrict the area of a source image to be used in an orthorectified tile, which reduces the required processing capacity needed to obtain the orthorectified tiles. Another advantage is that all orthorectified tiles could have the same resolution, which is very helpful by the generation of an orthorectified mosaic as the orthorectified tiles from the same camera can be superposed immediately, without any scaling.

In a further embodiment of the invention, the orthorectified tile comprise pixels, and converting source images includes:
 determining at least one pixel in the source image corresponding to a pixel of the orthorectified tile;
 determining the value of the pixel of the orthorectified tile from the values of the at least one pixel in the source image. This feature enables the engineer practicing the invention to determine efficiently the value of a pixel in the orthorectified tile. Firstly, the position of a pixel in the orthorectified tile is used to calculate the corresponding position in the source image. Secondly, the value of the pixel in the orthorectified tile is determined. The value could be a copy of the pixel in the source image whose position is nearest to the calculated position in the source image. However, the value could also be the average value of neighboring pixels in the source image or a value based on object recognition in the source image.

In a further embodiment of the invention the shape of the predefined orthorectified tile is a rectangle. This feature enables us to have orthorectified tiles with the same size, which further improves the alignment of the orthorectified tiles to obtain the orthorectified mosaic. Orthorectified tiles could be aligned by superimposing or matching identical objects that are located differently in two images.

In an embodiment of the invention, the sequence of source images has been obtained by a camera mounted on a vehicle moving over a surface of the earth, the orientation data include variable orientation parameters having a relationship with an angle between a defined orientation of the vehicle and the driving direction of the vehicle. These features enable us to take into account the inclination and roll of the camera with respect to the road surface due to the suspension system of the vehicle. This enables us to perform accurately the conversion from a source image to an orthorectified tile, which in turn enables us to easily superimpose the orthorectified tiles so as to obtain an orthorectified mosaic.

In an embodiment of the invention, the sequence of source images has been obtained by a camera mounted on a vehicle moving over the surface of the earth, the orientation data include variable orientation parameters having a relationship with an angle between a plane defined by the road surface and a horizontal plane. The horizontal plane corresponds to the shape defined by the geographic coordinate reference system that approximates the shape of the earth. These features enables us to correct for road slope and road cross fall, which enables us to obtain a more accurate orthorectified view of the road surface, wherein the looking axis of each pixel coincides with the gravity vector or is perpendicular to the approximated plane of the earth. In a further embodiment, variable orientation parameters have a relationship with an angle between the plane defined by the road surface below the moving vehicle and a horizontal plane. In this embodiment the movement of the car due to the springs are taken into account. The variable orientation parameters could be defined by the car pitch and car roll. These parameters enable us to generate more accurately an orthorectified tile.

In an embodiment of the invention converting includes:
 correcting geometric distortion in the source images;
 performing a 3D rotation over a focal point of the camera so as to obtain a vertical image;
 converting the vertical image into an orthorectified tile.
These features enables us to correct firstly for all constant variations and subsequently for all variable variations.

A further aspect of the invention relates to a method for generating an orthorectified mosaic comprising
 generating orthorectified tiles and corresponding metadata from source images obtained by means of a terrestrial based camera by means of the method of generating an orthorectified tile according to the invention;
 generating the orthorectified mosaic and meta data from the orthorectified tiles and corresponding metadata.

In an embodiment of the invention, generating an orthorectified mosaic includes:
 define a projected coordinate reference system for the orthorectified mosaic from the position data;
 determine an area of orthorectified tile in orthorectified mosaic by means of the projected coordinate reference system and metadata corresponding to said orthorectified tile;
 converting pixels of the determined area of orthorectified tile into pixels of orthorectified mosaic.

Using this embodiment enables us to generate the orthorectified mosaic. Initially a projected coordinate reference system for the orthorectified mosaic is defined. The projected coordinate reference system defines the geo-position of the pixels of the orthorectified mosaic. Subsequently, for each pixel or area in the orthorectified mosaic the corresponding orthorectified tile and area is determined and the values of the area in the orthorectified tile are used to obtain the corresponding values in the orthorectified mosaic. In this way, the orthorectified mosaic is an image being a mosaic of at least parts of several orthorectified tiles.

A further aspect of the invention relates to a processor readable storage medium carrying an orthorectified mosaic obtained by the method according to the claims, a computer program product comprising instructions, which when loaded on a computer arrangement, allows said computer arrangement to perform any one of the methods according to the claims, and a processor readable medium carrying a computer program product, when loaded on a computer arrangement, allows said computer arrangement to perform any one of the methods according to the claims.

A further aspect of the invention relates to a method of collecting both positionally accurate horizontal information and positionally accurate vertical information from source images of at least one terrestrial based image sequence obtained by a terrestrial based camera mounted on a moving vehicle driving across the earth surface, the method comprises:
 retrieving source images;
 retrieving position data associated with the source images, wherein the position data includes constant position parameters defining a relationship with the reference position within the vehicle and variable parameters in a geographic coordinate reference system corresponding to the coordinate location of the vehicle's reference position in said coordinate reference system;
 retrieving orientation data associated with the source images, wherein the orientation data includes constant orientation parameters having a relationship with the orientation of the camera with respect to a reference orientation of the vehicle and variable orientation parameters in said geographic coordinate reference system corresponding to the orientation of the reference orientation of the vehicle in said coordinate reference system;

retrieving horizontal information and corresponding position from the source images, wherein the position has been obtained by converting at least partially source images comprising at least partially the horizontal information by means of position data and orientation data associated with the source images to obtain an orthorectified representation of the horizontal information, the orthorectified representation comprises image data and metadata defining the conversion of pixel coordinates of the orthorectified representation to a position in the geographic coordinate reference system;

retrieving vertical information from at least one source image and locating the position of said vertical information by means of the position data and orientation data associated with the source images; and.

storing said vertical and horizontal information and associated positions for use in a map database.

This aspect of the invention enables us retrieve from one data source both horizontal information and vertical information. For both type of information there is one source image which comprises them at least partially. This image makes it possible to determine accurately the geo-position of horizontal information as well as the vertical information. Vertical information, e.g. a sign post, is normally visible in one image, whereas horizontal information, e.g. the lanes before a crossing, extends over several images. Therefore, pixels and position and orientation information from more then one source image could be needed to obtain the accurate position of horizontal information. The accurate geo-position of the horizontal and vertical information enables to construct accurately a perspective image that has both vertical data, such as road signs, and horizontal data, such as center lines, all together having the same reference plane for their respective position data. Only one data source is used to determine both the horizontal data and the vertical data. As all data is extracted from one data source, a very accurate relative position measurements can be obtained. Furthermore, the cost to extract the vertical and horizontal data are low compared to the cost to extract horizontal data from aerial images and vertical data from terrestrial based images.

A further aspect of the invention relates to a method of collecting both positionally accurate horizontal information and positionally accurate object information from at least one source image obtained by a terrestrial based camera mounted on a moving vehicle driving across the earth surface, wherein an attachment point at which the object is visibly attached to the ground is visible in at least one pixel of the at least one source image, the method comprises:

retrieving the at least one source image;

retrieving position data associated with the at least one source image, wherein the position data includes constant position parameters defining a relationship with the reference position within the vehicle and variable parameters in a geographic coordinate reference system corresponding to the coordinate location of the vehicle's reference position in said coordinate reference system;

retrieving orientation data associated with the at least one source image, wherein the orientation data includes constant orientation parameters having a relationship with the orientation of the camera with respect to a reference orientation of the vehicle and variable orientation parameters in said geographic coordinate reference system corresponding to the orientation of the reference orientation of the vehicle in said coordinate reference system;

retrieving horizontal information and corresponding position in the geographic coordinate reference system from the at least one source image, wherein the position has been obtained by determining by means of the position data and orientation data associated with the at least one source image, the orthorectified position of at least one source image pixel associated to horizontal information;

retrieving object information from the at least one source image;

determining the at least one pixel corresponding to the attachment point of the object to the ground and determining by means of the position data and orientation data associated with the at least one source image, the orthorectified position in the geographic coordinate reference system of at least one pixel corresponding to the attachment point of the object to the ground;

storing said object information and horizontal information and associated positions in the geographic coordinate reference system for use in a map database.

This aspect of the invention enables us to derive very accurately the geo-position of both the horizontal information and object information for use in a digital map. By means of the invention the position of the pixels corresponding to the ground can be determined accurately. Therefore, the position of the pixels which could be associated with both the ground and the object are determined accurately, and consequently the position of the object is accurately known.

The present invention can be implemented using software, hardware, or a combination of software and hardware. When all or portions of the present invention are implemented in software, that software can reside on a processor readable storage medium. Examples of appropriate processor readable storage medium include a floppy disk, hard disk, CD ROM, DVD, memory IC, etc. When the system includes hardware, the hardware may include an output device (e.g. a monitor, speaker or printer), an input device (e.g. a keyboard, pointing device and/or a microphone), and a processor in communication with the output device and processor readable storage medium in communication with the processor. The processor readable storage medium stores code capable of programming the processor to perform the actions to implement the present invention. The process of the present invention can also be implemented on a server that can be accessed over telephone lines or other network or internet connection.

SHORT DESCRIPTION OF DRAWINGS

The present invention will be discussed in more detail below, using a number of exemplary embodiments, with reference to the attached drawings, in which FIG. 1 shows a side view of the general principle of conversion of source images into orthorectified tiles;

DETAILED DESCRIPTION OF EXEMPLARY EMBODIMENTS

Figure 1:
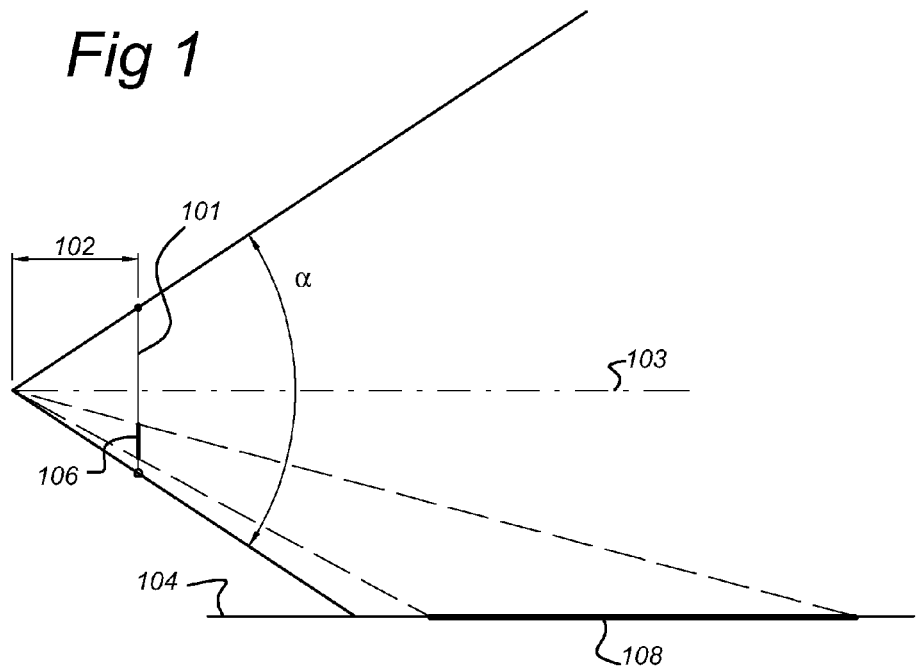

FIG. 1 shows a side view of the general principle of conversion of source images into orthorectified tiles. An image sensor 101 in a camera or CCD-camera 202 (shown in FIG. 2) records a sequence of source images. The source images represent more or less vertical images which are recorded by a terrestrial based camera. The source images could be a sequence of still pictures recorded by means of a still picture camera, which camera is triggered every displacement of e.g. 10 meter. A camera comprising the image sensor has an angle of view $\alpha$. The angle of view $\alpha$ is determined by the focal length 102 of the lenses of the camera. The angle of view $\alpha$ could be in the range of $45°<\alpha<180°$. Furthermore, the camera has a looking axis 103, which is in the centre of the angle of view. In FIG. 1, the looking axis 103 is parallel to a horizontal plane 104. The image sensor 101 is mounted perpendicular to the looking axis 103. In this case, the image sensor 101 records "pure" vertical source images. If further the height of the image sensor is known with respect to a horizontal plane, e.g. the earth surface, the image recorded by the image sensor 101 can be converted to an orthorectified tile representing a scaled version of the orthorectified view of the horizontal plane. To obtain a horizon image with a suitable resolution in the horizontal direction, a limited area of the image sensor is used. FIG. 1 shows the part 106 of the image sensor 101 that corresponds to the part 108 in the horizontal plane. The minimal acceptable resolution of the orthorectified tile determines the maximum distance between the image sensor and the farthest point in the horizontal plane. By means of trigonometry the source image retrieved from the terrestrial based camera can be converted to any virtual plane. Even if the looking axis is angled with a known angle with respect to the horizontal plane, an orthorectified tile can be obtained from a source image.

Figure 2:
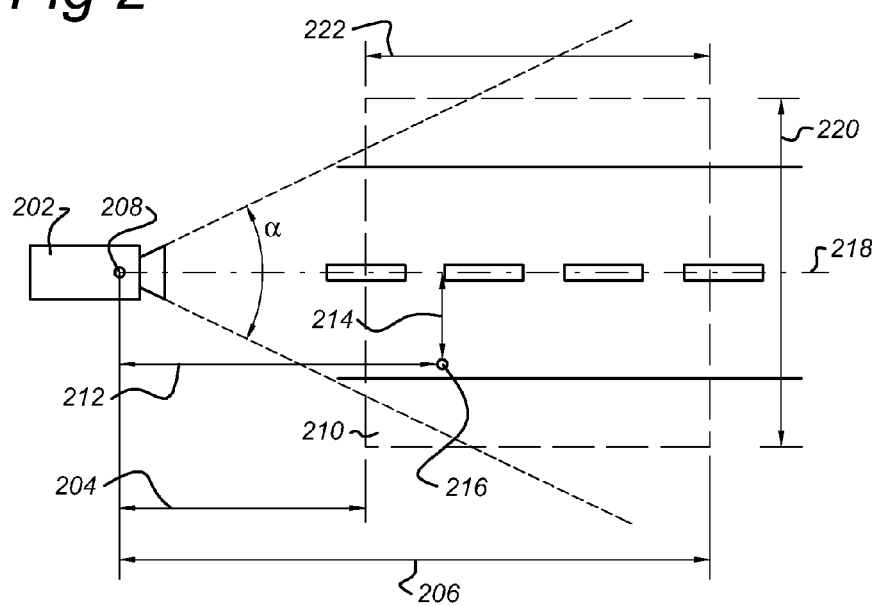
FIG. 2 shows an orthorectified view of the general principle of conversion of source images into orthorectified tiles.

FIG. 2 shows an orthorectified view of the general principle of conversion of source images into orthorectified tiles. The viewing angle $\alpha$, the looking axis 218 and the distance between the camera 202 determine the part of the horizontal plane that is recorded by the image sensor 101. In principle when the source image is converted to an orthorectified tile, the orthorectified tile corresponding to the source image has the shape of a triangle. The border of the orthorectified tile is indicated by reference 210. However the invention is of particular interest to obtain orthorectified mosaics of road surfaces for the collection of attributes of a digital map used in navigation systems and the like. It should be noted that in principle an orthorectified tile is already an orthorectified mosaic, however in the current description an orthorectified mosaic is a composition of several orthorectified tiles. Collection of the attributes and accuracy necessary for navigation systems and the like require a predefined minimum resolution of the orthorectified mosaics. These requirements restrict the part of the horizontal plane that could be obtained from the source images. The maximum distance 206 between the position of the camera focal point 208 with respect to the horizontal plane and the boundary of the area of the horizontal plane determines the resolution. Furthermore, practically, the maximum distance 206 could be restricted by the minimum distance between two cars when driving on a particular road. By limiting the maximum distance thusly, it has the advantage that in most cases the road surface in the orthorectified tile does not comprise the back of a car driving in front of the mobile mapping vehicle. Furthermore, the difference between maximum distance 206 and minimum distance 204 determines the maximum allowable distance between subsequent recordings of images by a camera. This could restrict the maximum driving speed of the vehicle. A rectangle of the horizontal plane corresponds to an area approximately having the form of a trapezoid in the source image. In an embodiment the orthorectified tile 210 corresponds to an area of 16 m width 220 and 16 m length 222. For further processing of the orthorectified tiles it is advantageous to have orthorectified tiles in the form of a rectangle.

In an embodiment of the conversion of the source image to obtain the orthorectified tile for each pixel 216, having a distance 214 from the looking axis and a distance 204 from the focal point 208, the corresponding position in the source image is determined by means of goniometry which will be described hereafter in more detail.

Figure 3:
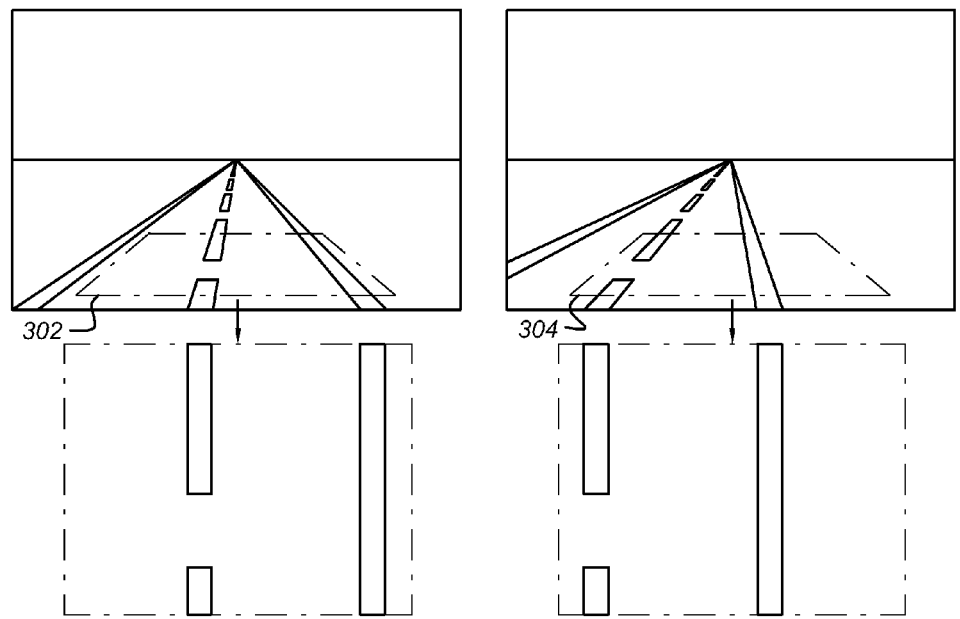
FIG. 3 shows the conversion of a stereoscopic image pair into two orthorectified tiles.
Figure 4:
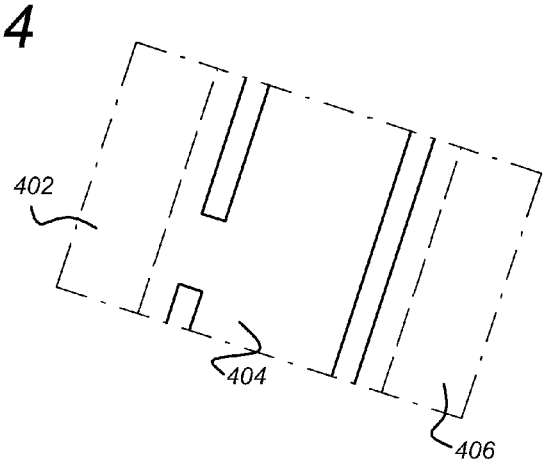
FIG. 4 shows the orthorectified mosaic obtained by combining the two orthorectified tiles in FIG. 3.

FIG. 3 shows at the upper side a stereoscopic pair of images. At the lower side two corresponding converted orthorectified tiles are shown. The value of a pixel in the orthorectified tiles could be derived by first determining by means of trigonometry or triangulation of the corresponding position in the source image and secondly copying the value of the nearest pixel in the source image. The value could also be obtained by interpolation between the four or 9 nearest pixels. In the event object recognition tools are used to analyze the source images, the area of road surfaces and the verge or shoulder could be detected in the source image. In that case the value could correspond to a value assigned to the corresponding area. The dashed lines 302 and 304 indicate the area of the source images used to obtain the orthorectified tiles. In a preferred embodiment the orthorectified tile is a rectangle. The use of a stereoscopic camera will result in two orthorectified tile sequences with a relatively large overlapping area. FIG. 4 shows the orthorectified mosaic obtained by combining the two orthorectified tiles in FIG. 3. The combining could be based on the geo-positions of the respective orthorectified tiles or after superimposing and matching of the orthorectified tiles. The geo-position of the orthorectified tiles could be derived from the GPS-position from the moving vehicle, the driving direction or orientation of the car, the position of the camera on the moving vehicle and the orientation of the camera on the moving vehicle. The left area 402 and the right area 406 of the orthorectified mosaic are obtained from the left and right orthorectified tile in FIG. 3, respectively. The middle area 404 of the orthorectified mosaic could be a copy of the area of the corresponding area of the left or the right orthorectified tile. The middle area 404 could also be the average value of the corresponding pixel value in the left and right orthorectified tile. An advantage of using a stereoscopic camera or two cameras in front is that a bigger/broader orthorectified mosaic could be obtained, as two camera can record images over a larger angle then only one of said cameras. Similarly, using a front looking camera in combination with side looking cameras enables us to obtain an accurate orthorectified mosaic from very broad roads, or streets with pavements.

It should be noted that in the above description of the invention, the horizontal plane corresponds to the road surface. This is done to describe briefly the general principle of the invention to convert a vertical image into a horizontal or orthorectified image. This is possible when there is a one-to-one relationship from image space of a source image to the image space of the orthorectified image. This enables us to project a pixel of the source image on a pixel of the orthorectified image. However, in reality the road surface does not correspond to the ellipsoid that approximates the shape of the earth. The road surface can have any height with respect to the surface of the ellipsoid and can have a slope with respect to the ellipsoid. These aspects of the invention will be described hereinafter. The position and orientation data captured by the MMS enables us to determine accurately the position and orientation of the camera in the geographic coordinate reference system. Furthermore, position and orientation data enables us to determine accurately the vector of the driving direction of the MMS. By assuming that the road surface is parallel to said vector, the 3D position of the road surface is known in the geographic coordinate reference system. The examples given above disclose how to project the source image on the plane approximating the road surface. A person skilled in the art knows how to project a road surface with a known 3D position in the geographic coordinate reference system on an orthorectified image with metadata defining the projected coordinate reference system of said image.

Figure 10:
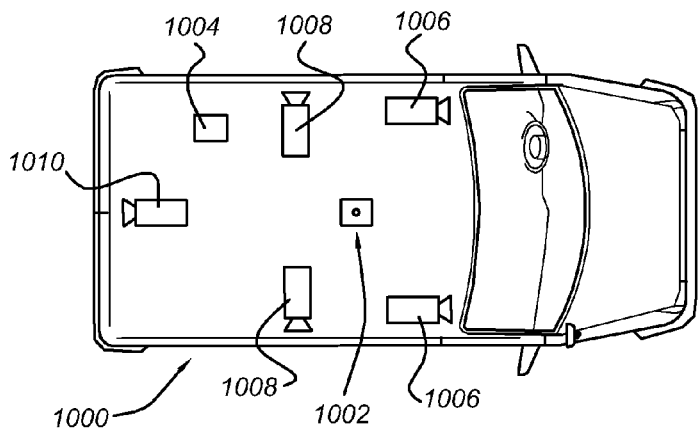
FIG. 10 is an orthorectified view of a mobile mapping vehicle.

The method according to the invention will be described hereinafter in more detail by means of an example implementation. By means of a mobile mapping vehicle 1000, as shown in FIG. 10, the input data is collected. A mobile mapping vehicle 1000 is equipped with positioning sensors 1002, e.g. a GPS-receiver and possibly additional inertial and dead reckoning sensors, and orientation sensors 1004, e.g. gyroscope and distance measurement unit. These sensors are commonly known. With these sensors the position and orientation of the vehicle in the geographic coordinate reference system can be determined very accurately. Furthermore, the mobile mapping vehicle is equipped with a number of cameras. Two cameras 1006 could be mounted in front of the car to record the images in front of the vehicle. These two cameras 1006 can be arranged to generate a sequence of stereoscopic image pairs. Furthermore, cameras 1008 could be mounted at the left and right side to obtain side views from the car and the camera 1010 at the rear of the vehicle to record the living world seen from the rear of the vehicle. If cameras are mounted on all sides of the vehicle a continuous view in all directions around the vehicle could be obtained. A camera in front and at the rear enables us to obtain two images sequences of the same road surface but from opposite directions. This enables us to obtain two source image sequences from the same road surface, which could be used to eliminate or detect errors in the orthorectified tiles representing the same road surface. An image sequence could be a video stream with a predefined frame rate. In an advantageous embodiment the camera is a still digital picture camera which is triggered to record a picture every time the vehicle has traveled a predetermined distance. In an embodiment the predetermined distance is 10 meters.

The input data to be used to generate orthorectified mosaics can be divided into two groups. The first group of data are constant parameters along a whole Mobile Mapping Service (MMS) session for each camera. They are related to position, calibration and orientation of the cameras in a local coordinate system of the vehicle.

Constant parameters are:
cam_dist=distance from the center of a GPS receiver to a camera focal point;
cam_pos_rot=rotation of the camera position with respect to length axis of the vehicle;
cam_look_angle=base rotation of the camera looking direction;
cam_dist_params=a group of parameters used in geometric distortion correction of source images;
cam_rot_x=local camera rotation in angle X;
cam_rot_y=local camera rotation in angle Y;
cam_rot_z=local camera rotation in angle Z;
cam_f=length of camera focal point
cam_dpx=resolution of CCD image sensor (pixels/meter);
cam_dpy=resolution of CCD image sensor (pixels/meter);
cam_h=height of camera above the road surface;
in_bmp_width=number of pixel in a row of the CCD sensor;
in_bmp_height=number of pixel in a column of the CCD sensor;
trans_bmp_width=number of pixel in a row of an orthorectified tile;
trans_bmp_height=number of pixel in a column of an orthorectified tile;
trans_real_width=size of width of orthorectified tile in horizontal plane;
trans_real_height=size of depth of orthorectified tile in horizontal plane;
trans_min_z=minimal distance of visible pixels from camera focal point 208
out_width=number of pixels in a line of the orthorectified mosaic;
out_height=number of pixels in a column of the orthorectified mosaic;
out_resolution=resolution of the orthorectified mosaic.

Variable parameters are:
car_lat=latitude of vehicle in WGS84 coordinate system;
car_lon=longitude of vehicle in WGS84 coordinate system;
car_heading=vehicle heading angle;
car_roll=roll of vehicle;
car_cross_fall=cross fall of road;
car_pitch=pitch of vehicle;
car_slope=slope of road;
in_bmp_bytes=the bytes representing a source image.

The WGS84 system is the World Geodetic System (WGS) which defines a fixed global reference frame for the Earth, for use in geodesy and navigation. The latest revision is WGS 84 dating from 1984, which will be valid up to about 2010. WGS84 is a geographic coordinate reference system. In principle the invention can be used for any geographic coordinate reference system.

The creation of an orthorectified mosaic is based on three stages. The main goal of the first stage is to correct for geometric distortion in the source images. Geometric distortion could be optical aberration of the lens system in a camera and irregularities in the light sensitive element of the camera, e.g. the CCD-sensor. The second stage is the conversion of the corrected source images into orthorectified tiles and the last stage is generating an orthorectified mosaic from the orthorectified tiles so as to obtain a map of the road surface of a particular road segment.

In the second stage the corrected source images are firstly 3D processed to obtain intermediate images which correspond to images which are perpendicular to the ground plane of the vehicle. In this phase constant orientation parameters, cam_rot_x, cam_rot_y, cam_rot_z and cam_f, and constant position parameters, cam_dpx and cam_dpy, are used to process the corrected images to obtain the intermediate images. Commonly known goniometry formulas are used to perform the 3D processing. In this phase is performed an image 3D rotation over the focal point with angles cam_rot_x, cam_rot_y, cam_rot_z, with resolution cam_dpx, cam_dpy and focal length cam_f.

The image 3D rotation could be performed by means of the following equation:

$$\begin{bmatrix} X_{NEW} \\ Y_{NEW} \\ A \\ B \end{bmatrix} = \begin{bmatrix} \cos\alpha_Y & 0 & \sin\alpha_Y & 0 \\ 0 & 1 & 0 & 0 \\ -\sin\alpha_Y & 0 & \cos\alpha_Y & 0 \\ 0 & 0 & 0 & 0 \end{bmatrix} \cdot \begin{bmatrix} 1 & 0 & 0 & 0 \\ 0 & \cos\alpha_X & -\sin\alpha_X & 0 \\ 0 & \sin\alpha_X & \cos\alpha_X & 0 \\ 0 & 0 & 0 & 1 \end{bmatrix} \cdot$$

$$\begin{bmatrix} \cos\alpha_Z & -\sin\alpha_Z & 0 & 0 \\ \sin\alpha_Z & \cos\alpha_Z & 0 & 0 \\ 0 & 0 & 1 & 0 \\ 0 & 0 & 0 & 1 \end{bmatrix} \cdot \begin{bmatrix} X_{FC} \\ Y_{FC} \\ f \\ 1 \end{bmatrix}$$

wherein:
$X_{FC}$=X distance from image center,
$Y_{FC}$=Y distance from image center,
f=focal length in pixels (cam_f),
$\alpha_X$=cam_rot_x,
$\alpha_Y$=cam_rot_y,
$\alpha_Z$=cam_rot_z,
$X_{NEW}$=X distance from center of 3D rotated image,
$Y_{NEW}$=Y distance from center of 3D rotated image,
$Y_{FC}$=Y distance from image center.

Figure 13:
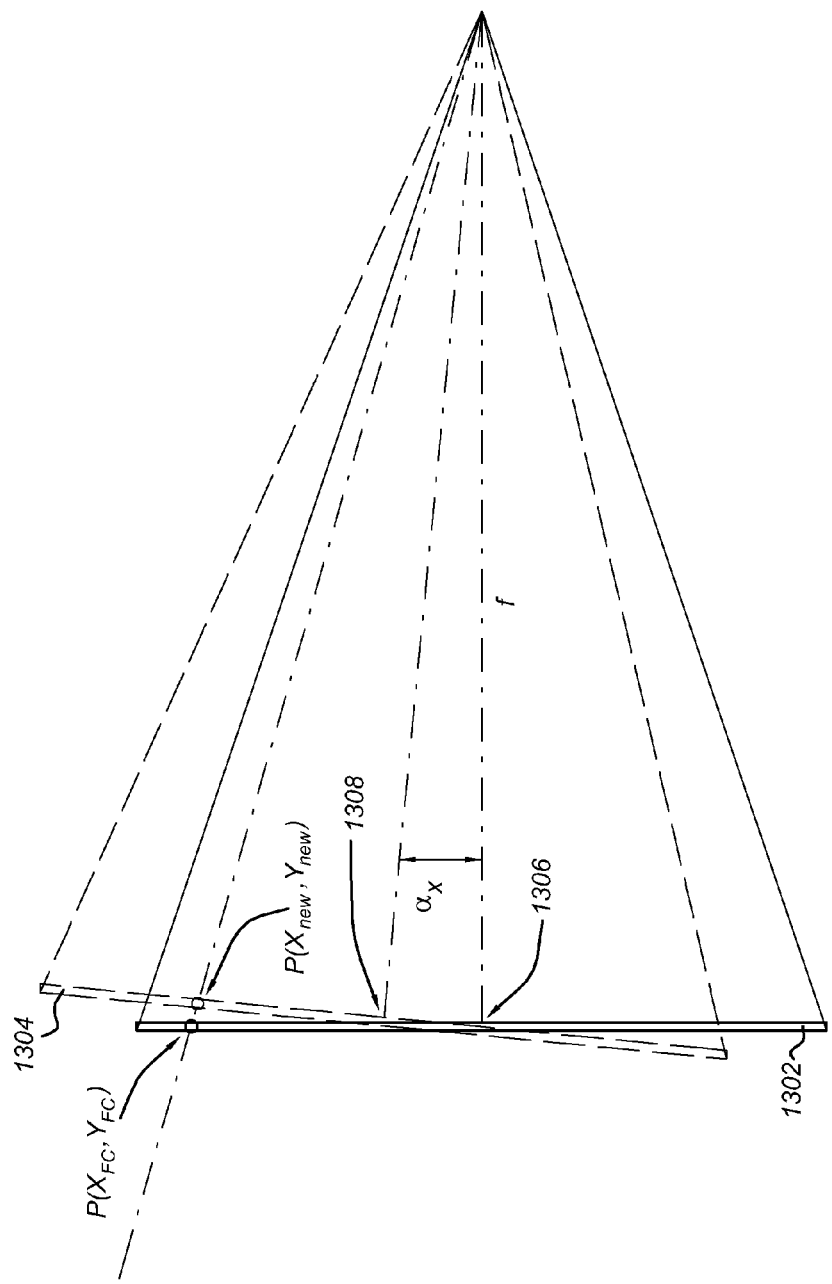
FIG. 13 shows illustrative the 3D rotation of an image over an angle $\alpha_x$.

FIG. 13 shows illustrative a rotation over angle $\alpha_X$. Pixel $P(X_{FC}, Y_{FC})$ in the source image 1302 will become pixel $P(X_{NEW}, Y_{NEW})$ in the intermediate image 1304. To obtain accurate orthorectified tiles, cam_rot_x, cam_rot_y and cam_rot_z should be determined with a precision around 0.1 degrees. Mounting a camera with said precision is nearly impossible. Therefore, the fixed calibration parameters cam_rot_x, cam_rot_y and cam_rot_z are determined after mounting the camera and used to calculate the intermediate images.

Subsequently, an intermediate image is converted from a vertical image to an orthorectified tile. In this special case, "vertical" means that the image is perpendicular to the ground plane or driving plane of the vehicle.

First, the resolution of the orthorectified tile is determined by the following equations:

$$\text{res\_x} = \frac{\text{trans\_real\_width}}{\text{trans\_bmp\_width}},$$

$$\text{res\_y} = \frac{\text{trans\_real\_height}}{\text{trans\_bmp\_height}}.$$

Figure 11:
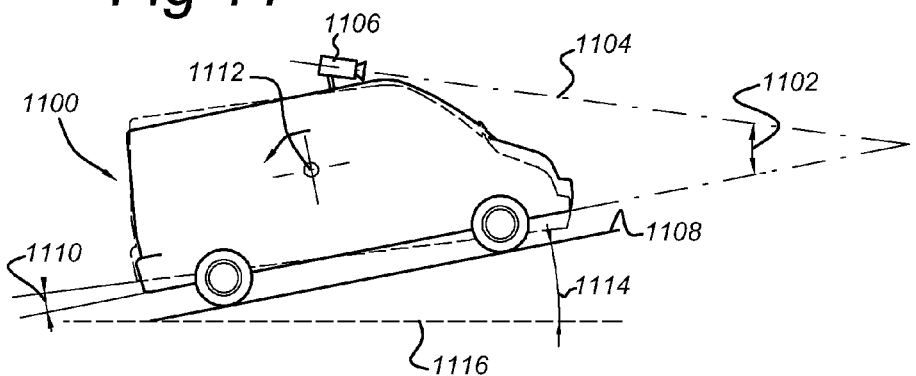
FIG. 11 is a side view of a mobile mapping vehicle driving on a road.

Secondly, the variable conversion parameters car_roll, car_pitch, car_slope, car_cross_fall about the car are used to calculate local picture angles. The values of the parameters car_slope and car_cross_fall define the angle of the surface of the road with respect to the surface of the ellipsoid that approximates the earth surface in the geographic coordinate system, whereas the values of the parameters car_roll and car_pitch depend on the acceleration/deceleration of the vehicle, the speed of the vehicle and the curvature of the road, and the surface of the road. FIG. 11 shows a side view of a mobile mapping vehicle 1100 to explain some conversions parameters. Constant conversion parameter cam_rot_x 1102 is defined by the angle between looking axis 1104 of the camera 1106 and the road surface 1108 below the vehicle if the vehicle remains stationary. In FIG. 11, it is assumed that the bottom plate of the vehicle is parallel to the road surface when the vehicle remains stationary. Variable orientation parameter car_pitch is the actual angle between the bottom plate of the vehicle body and the horizontal plane 116 with respect to the driving direction. It should be noted that according to the invention the horizontal plane corresponds to the surface defined by the geographic coordinate reference system that approximates the shape of the earth. In the embodiment described above, it was assumed that the road surface was on the approximated shape of the earth. However, this will normally not be the case. Furthermore to enable an accurate conversion of a source image into an orthorectified tile the car_slope 1114 has to be taken into account. The car_slope 1114 is the angle of inclination in the driving direction of the road surface 1108 with respect to a horizontal plane 1116. During driving the values of car_slope and car_pitch differ due to acceleration and deceleration of the vehicle. The difference 1110 corresponds to a rotation of the vehicle over a width axis 1112. This rotation is caused by acceleration and deceleration of the vehicle 1100. A person skilled in the art knows how the car_slope 1114 can be derived directly from the position and orientation data captured by the GPS, inertial system and distance measurement instrument (DMI). The difference 1110 can be approximated by a function that models the mass-spring behavior of the vehicle. Input for this function is the acceleration in the heading direction of the vehicle, which is available from the DMI system. Furthermore, the car_pitch can be derived from the difference between the car_slope 1114 and the actual orientation of the bottom plate of the vehicle.

Figure 12:
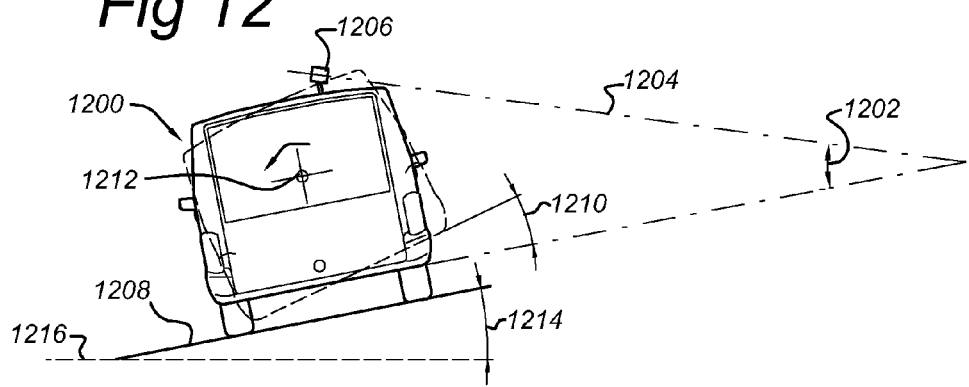
FIG. 12 is a rear view of a mobile mapping vehicle driving on a road.

FIG. 12 shows a rear view of a mobile mapping vehicle 1200 to explain some other conversions parameters. Constant conversion parameter cam_rot_z 1202 is defined by the angle between a horizontal line 1204 of source image of the camera 1206 and the road surface 1208 below the vehicle if the vehicle remains stationary. In FIG. 12, it is assumed that the bottom plate of the vehicle is parallel to the road surface when the vehicle remains stationary. Variable orientation parameter car_roll is the actual angle between the bottom plate of the vehicle body and the horizontal plane 1216 perpendicular to the driving direction. Furthermore to enable an accurate conversion of a source image into an orthorectified tile the car_cross_fall 1214 has to be taken into account. The car_cross_fall or cant 1214 is the angle defined by the difference in elevation of the two sides of a road 1208 with respect to a horizontal plane 1216. Normally the cant of a road helps a vehicle to go more easily around a curve. During driving the values of car_roll and car_cross_fall differ due to leaning of the vehicle. The difference 1210 corresponds to a rotation of the vehicle over a length axis 1212 of the vehicle 1200. This rotation is caused by taking a bend with a spring system. A person skilled in the art knows how the car_roll can be derived directly from the position and orientation data captured by the GPS, inertial system and distance measurement instrument (DMI). The difference 1210 can be determined by means of a function that models the mass-spring behavior of the vehicle in a bend. Input for this function is the acceleration of the vehicle perpendicular to the heading direction of the vehicle, which is available from the inertial navigation system or can be derived from the track-line and the velocity of the vehicle, which is available from the DMI system. In this way, the cant 1214 can be determined by subtracting difference 1210 from car_roll. For straight roads, the car_cross_fall 1214 can be approximated by averaging the car_roll over a window of 50 meter. In this way, errors in the projection on the orthorectified image due to the roll of the car due to bumpiness of the road surface can be reduced. A person skilled in the art would recognize other straightforward solutions to derive the roll of the vehicle with respect to the road surface below the vehicle, for example measuring simultaneously the length of the springs of the vehicle.

The following equations are used to determine the local picture angles from the variable conversion parameter:

Δroll=car_roll−car_cross_fall,

Δpitch=car_pitch−car_slope, local_rot_x=Δroll·sin(cam_look_angle)+Δpitch·cos(cam_look_angle), local_rot_z=Δroll·cos(cam_look_angle)−pitch·sin(cam_look_angle), In the equations given above, the parameters car_roll, car_cross_fall, car_pitch and car_slope at the same time instant are determined and are associated with a source image (or images in the case of a stereo pair). This could be done if the mobile mapping vehicle is driving on relatively flat roads. In that case the car_cross_fall and car_slope below the mobile mapping vehicle is substantially similar to the car_cross_fall and car_slope of the road in the source image. Parameter Δpitch 1110 corresponds the rotation angle of the vehicle over the width axis 1112 and parameter Δroll 1210 corresponds the rotation angle of the vehicle over the length axis 1212.

However in the event the mobile mapping vehicle is driving on uneven road surfaces, e.g. bridges in old cities and cities build on a hill, the car_cross_fall and car_slope of the road surface heading the mobile mapping vehicle recorded by the source image could differ significantly from the car_cross_fall and car_slope of the road surface below the mobile mapping vehicle at the time instant when the source image is recorded. In that event, the conversion of the source image into an orthorectified tile could be improved by using the car_cross_fall and car_slope registered at the moment the mobile mapping vehicle was at the position of the road surface corresponding to area of the source image to be used to obtain the corresponding orthorectified tile. In this event the conversion of the source image by means of corresponding position data and orientation data to obtain the orthorectified tile uses orientation data obtained at different time instances. If for example, a still picture camera is used to obtain the source images and every 10 meters a picture is recorded with the corresponding position data and orientation data and the orthorectified tile corresponds to the road surface which is from 5 up to 25 meters in front of the mobile mapping vehicle, for the conversion the car_slope and car_cross_fall of the two subsequent source images could be used. It is even possible to use the average value of the car_slope and car_cross_fall of the two subsequent source images to approximate the car_slope and the car_cross_fall in front of the vehicle. In this way the position and orientation of the plane approximating the road surface in the geographic coordinate reference system is defined, which enables us to project the plane correctly on the orthorectified tile.

FIGS. 11 and 12 make clear that to obtain the orthorectified tile an estimation is made for a plane corresponding to the earth surface seen in a source image in dependence of the position and orientation data associated with the source images. The position and orientation data enables us to determine the position and orientation of the road surface below the vehicle. The corresponding to the road surface below the vehicle is in an embodiment the approximation of the plane in front of the vehicle seen in the source image. As the slope of the road changes gradually, this is in most cases a good approximation. In another embodiment, the position and orientation data associated with source images captured when the vehicle is positioned at the road surface seen in a previously captured source image is used to approximate the plane of the road surface. In this way, the position and orientation of a road surface seen in a source image can be estimated more accurately, enabling us to improve the accuracy of the orthorectified tile.

Then for each pixel 216 of the orthorectified tile 210 the distance 212 from the camera focal point 208 (pt_dist_z) and the distance 214 from the camera looking axis 218 (pt_dist_x) in the virtual horizontal plain is determined. The values of res_x, res_y, trans_min_z, trans_bmp_width and trans_bmp_height.

The Y coordinate (src_temp_y) and X coordinate (src_temp_x) of a pixel of a vertical image is calculate by means of the following equations:

$$\text{temp\_x\_rot} = \arctan\left(\frac{\text{cam\_h}\cdot\left(1 - \frac{\text{cam\_f}}{\text{pt\_dist\_z}}\right)}{\text{pt\_dist\_z}}\right) + \text{local\_rot\_x},$$

$$\text{src\_temp\_y} = \text{cam\_f}\cdot\tan(\text{temp\_x\_rot}).$$

$$\text{src\_temp\_x} = \frac{\text{cam\_f}\cdot\text{pt\_dist\_x}}{\text{pt\_dist\_z}},$$

wherein the unity of src_temp_y and src_temp_x is in meters on the CCD. The variable src_temp_x defines the X axis distance in meters on the CCD from the center of the image. By means of the values of src_temp_y, src_temp_x and local_rot_z the X,Y source coordinates (src_x_m, src_y_m) in meters on CCD could be determined with the following equation:

src_x_m=src_temp_x·cos(local_rot_z)−src_temp_y·sin(local_rot_z)

src_y_m=src_temp_x·sin(local_rot_z)+src_temp_y·cos(local_rot_z)

Finally, in an embodiment of the invention the picture coordinates of pixels of the vertical image, which correspond to the position of a pixel of an orthorectified tile are determined by the equation:

src_x_px=in_bmp_width/2+floor(src_x_m*cam_dpx)

src_y_px=in_bmp_height/2+floor(src_y_m*cam_dpy).

In an embodiment of the invention the RGB values from a (src_x_px, src_y_py) pixel of the intermediate vertical image is copied into a (dst_x, dst_y) pixel of the orthorectified tile. If there is no corresponding pixel in the intermediate vertical image for a pixel of the orthorectified tile, the pixel in the orthorectified tile will obtain a predefined value. Preferably, the predefined value corresponds to a black pixel(=RBG(0,0, 0)). In this embodiment the value of a pixel of the orthorectified tile is a copy of the value of the determined corresponding pixel in the intermediate vertical image.

In another embodiment the values of src_x_m and src_y_m could be used to determine the four most neighboring pixels in the intermediate vertical image. The value of a pixel in the orthorectified tile could then be derived from the values of said four most neighboring pixels, for example by averaging the four values or by means of interpolation.

Figure 5:
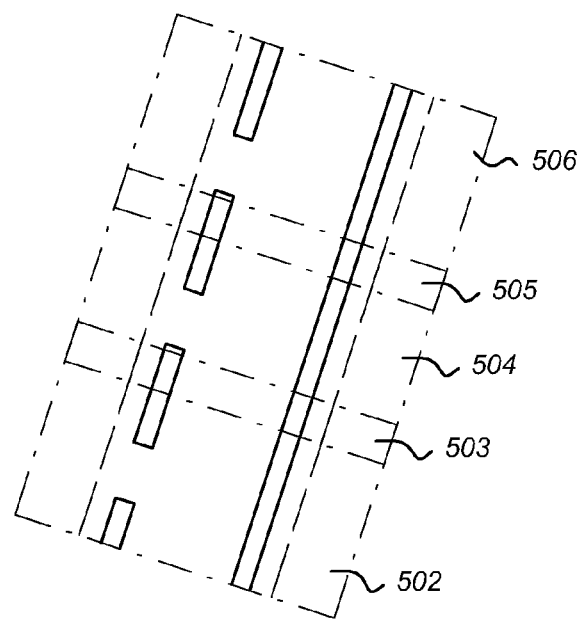
FIG. 5 shows a first example of the composition of an orthorectified mosaic of a sequence of stereoscopic image pairs.

FIG. 5 shows a first example of the composition of an orthorectified mosaic of a sequence of stereoscopic image pairs. The orthorectified mosaic in FIG. 5 is obtained by combining three subsequent stereoscopic image pairs 502, 504, 506. Thus six images have been used to obtain the orthorectified mosaic. Some pixel values could be obtained from only one orthorectified tile. Other pixel values could be obtained from more than one orthorectified tile. In that case when superimposing the orthorectified tiles, there are overlapping areas 503, 505. There are several methods to obtain the pixel values in overlapping areas. A pixel value could be obtained from only one orthorectified tile or a pixel value could be derived from all the overlapping pixels, for example by averaging.

Figure 6:
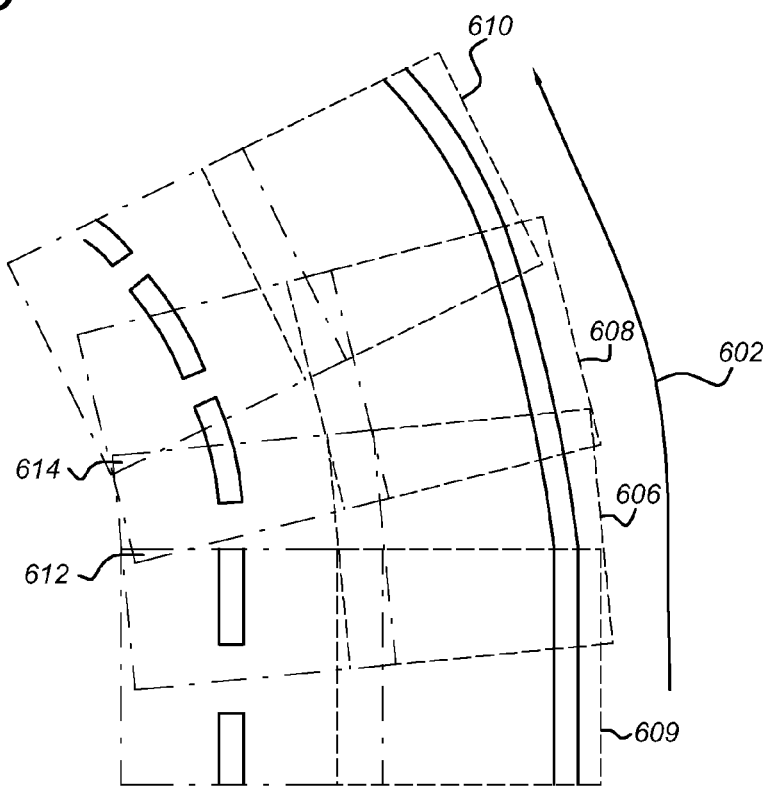
FIG. 6 shows a second example of the composition of an orthorectified mosaic of a sequence of stereoscopic image pairs.

FIG. 6 shows a second example of the composition of an orthorectified mosaic of a sequence of stereoscopic image pairs. Whereas in the example of FIG. 5 the subsequent images has been obtained while the vehicle was driving straight ahead, in the example of FIG. 6 the subsequent images have been obtained while the vehicle follows a bend in the road. The direction of the car is indicated by 602. FIG. 6, shows four subsequent orthorectified tiles 604, 606, 608 and 610. From FIG. 6 can be seen that the orientation of each orthorectified tile changes in the orthorectified mosaic. The orthorectified tiles can be properly superimposed by using the metadata comprising geo-reference data corresponding to each image describing the one-to-one relationship from the image coordinate system to the geographic coordinate reference system. In the example given in FIG. 6, the value of some pixels of the orthorectified mosaic could be obtained from three different orthorectified tiles. The two areas indicated by 612 and 614 comprises said pixels.

It should be noted that to perform a vertical to orthorectified tile conversion, it isn't necessary to have stereo pair of images as shown in the examples given. The orthorectified tile is correct as long as the camera orientation calibration and position measurements are correct and the converted road point is in the same plane as the car.

Figure 7:
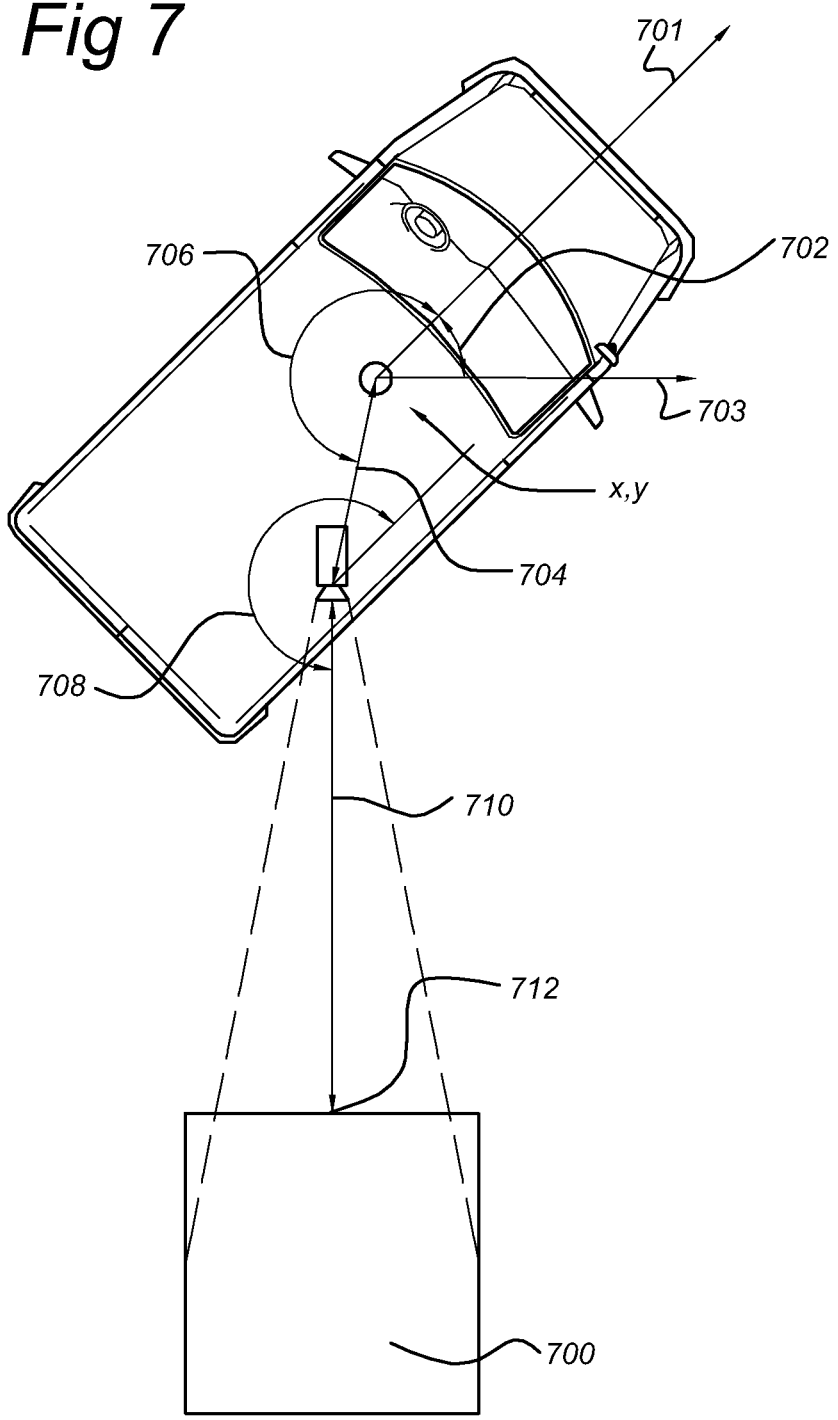
FIG. 7 shows an orthorectified view of a mobile mapping vehicle and orthorectified tile.

To obtain an orthorectified mosaic from the orthorectified tiles the following algorithm is used. First a local coordinate projection is created. The local coordinate projection could be based on the geo-reference data from the MMS collected session data. The local coordinate projection could also be defined by user defined area with coordinates which defines the one-to-one relationship with geo-positions in the geographic coordinate reference system. The local coordinate projection defines the relationship between the position of a pixel in the orthorectified mosaic and a geo-position. For every orthorectified tile the position of an orthorectified tile in the orthorectified mosaic is determined. Firstly, the car position in the orthorectified mosaic is determine by using the values of car_lon, car_lat x,y. Secondly, a base position 712 of the orthorectified tile 700 in the orthorectified mosaic is determined by using the values of car_heading 702, cam_dist 704, cam_pos_rot 706, cam_look_angle 708, trans_min_z 710 associated with the horizontal frame. FIG. 7 shows a top view of a mobile mapping vehicle and orthorectified tile and the corresponding parameters. It should be noted that the orientation of the camera in FIG. 7 with respect to the vehicle is not ideal for obtaining an orthorectified mosaic of the road surface. Present FIG. 7 makes clear the definition of the respective parameters. Some of the parameters would not be clear in the event FIG. 7 would show an ideal orientation of the camera in which the camera is mounted in the front of the vehicle and records the surface in front of the vehicle. Parameter car_heading is the angle between the driving direction of the car 701 and a predefined reference direction 703. The predefined reference direction 703 could be the direction pointing to the North Pole. Parameter car_pos_rot 706 is defined by the angle between the car direction 701 and the line 704. Line 704 corresponds to the parameter cam_dist which is the distance between the camera and the position x,y of the car. The position x,y corresponds to the position of the car obtained by a GPS-receiver. Parameter cam_look_angle 708 is defined by the angle between the looking axis 710 of the camera and the car direction 701.

Thirdly, the position of the corners of an orthorectified tile in the orthorectified mosaic is determined by using the values of trans_bmp_width, trans_bmp_height, trans_real_width and trans_real_height associated with the orthorectified tile. Fourthly, orthorectified tiles with at least one pixel falling within the area defined by the orthorectified mosaic are selected and the area of pixels in the orthorectified mosaic corresponding to the area of the pixels falling within the area defined by the orthorectified mosaic is determined by using the position of the corners determined in the third action and the parameters out_width, out_height and out_resolution. By means of the determined areas a mosaic for the orthorectified mosaic is generated, wherein each piece of the mosaic represents a whole orthorectified tile or at least a part of an orthorectified tile. Finally, the pieces of the mosaic are used to build-up the orthorectified mosaic. Each piece of the mosaic corresponds to an area of an orthorectified tile. An efficient implementation of the current invention is when single tiles are orthorectified in local projection (e.g. Gauss-Krieger projection with base longitude set as middle of track line). The pixels of said area of the orthorectified tile could be used after proper linear conversion of the orthorectified tile to obtain the pixel values for the orthorectified mosaic. The linear conversion is defined by the converting parameters of the given local projection to a global coordinate system such as WGS-84. Linearity is assumed for speeding up the conversion, potential error introduced by such assumption is several factors lower then pixel size.

The orthorectified mosaic obtained via the mosaic of orthorectified tiles enables to interpret easily at least the following: lane information, horizontal signage, lane connectivity attributes, road lines and road widths.

Figure 8:
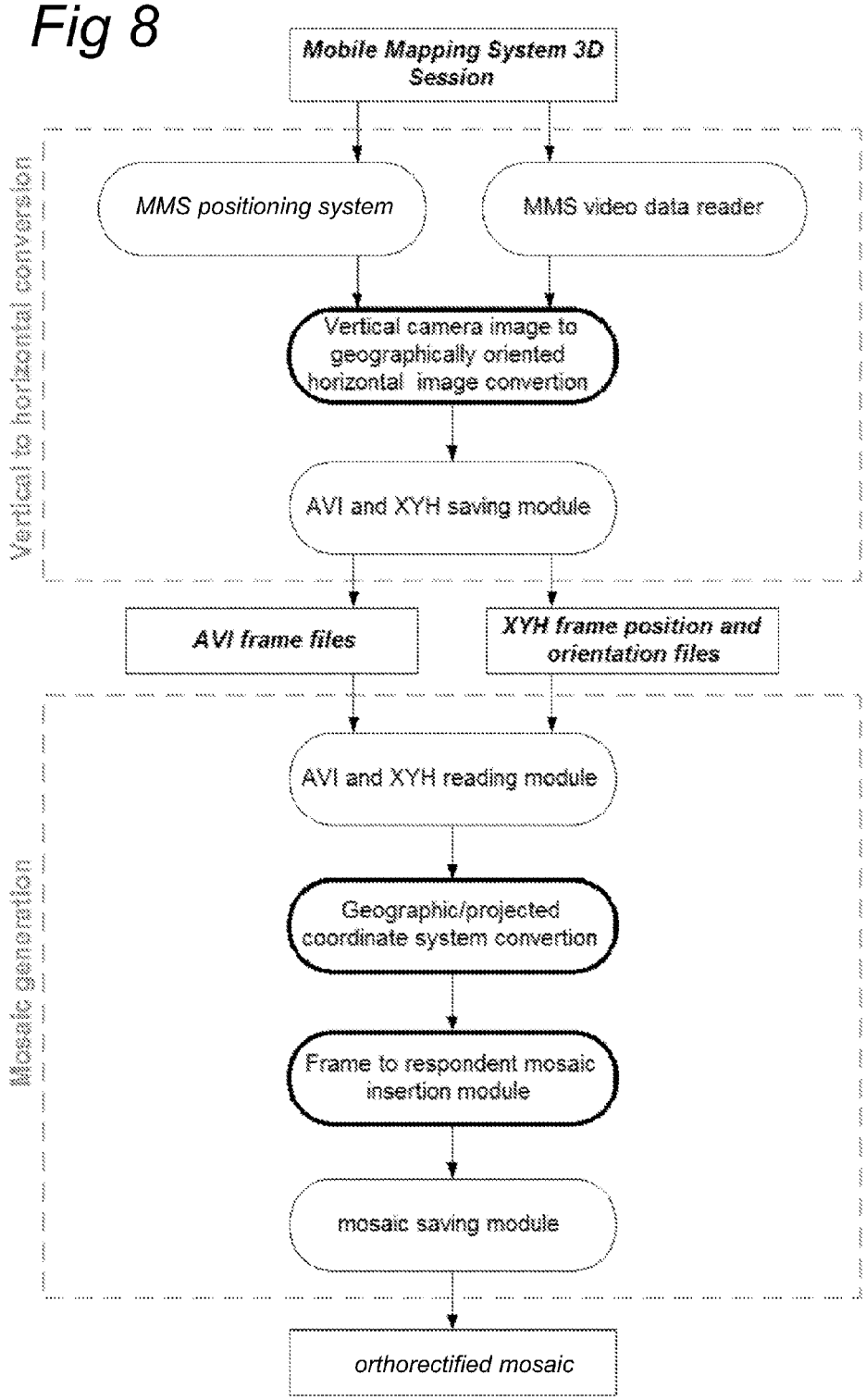
FIG. 8 is a block diagram of an exemplar implementation of the method according to the invention.

FIG. 8 is a block diagram of an exemplar implementation of the method according to the invention. A mobile mapping vehicle riding on roads records by means of several camera the surrounding of the vehicle an in particular the road surface. Furthermore, simultaneously the geo-position of the mobile mapping vehicle is recorded. The recording is performed during a mobile mapping system 3D Session. The data recorded is first supplied to a conversion process which performs the vertical to horizontal conversion. The term vertical does mean that the looking angle of the camera is not restricted to be parallel to the road surface, which means that the looking angle can be any reasonable looking angle not being perpendicular to the road surface as long as it encompasses at least partially a road surface. The conversion process retrieves the position and orientation data from the mobile mapping system 3D session to generate the constant and variable parameter by means of a MMS positioning system and algorithms.

Furthermore, the recorded images sequences are retrieved by a MMS data reader. The image sequences together with the constant and variable parameters are supplied to a conversion step which converts the vertical camera images to geographically oriented orthorectified tiles. In an embodiment the orthorectified tiles are stored as image sequences, such as windows *.avi format as known by one familiar with the art, and the x-coordinates, y-coordinates and height coordinates together with the orientation of the images are stored in XYH frame position and orientation files which form the metadata associated with the orthorectified tiles.

The AVI frame files comprising the orthorectified tiles and meta data comprising the XYH frame position and orientation files are supplied to a mosaic generation process, which processes the supplied files to obtain an orthorectified mosaic. The orthorectified mosaic is obtained by assembling a number of orthorectified tiles into a single, composite picture. Firstly the AVI and XYH frame files are retrieved by an AVI and XYH reading module. Secondly the geographic information that is found in the XYH files is converted to the projected coordinate system and the conversion from the pixels of the orthorectified tiles to pixels of the orthorectified mosaic is determined. A mosaic is determined which is used to generate pieces of the orthorectified mosaic. The frame to respondent mosaic insertion module calculates the values of the pixels of the respective pieces of the mosaic from the corresponding AVI frames. And finally the saving module combines all the pieces of the mosaic to obtain the orthorectified mosaic and stores the orthorectified mosaic in a memory. The memory could be any processor readable storage medium, such as a Flash memory, a RAM, an optical Disc and hard disk. It should be noted that the orthorectified mosaic could easily be used to generate a map based on every useful geographical coordinate reference system, projected coordinate system or local spatial coordinate system. The coordinate system defines the conversion to be performed. A bird view map could also be very easily obtained by converting the orthorectified mosaic.

Figure 14:
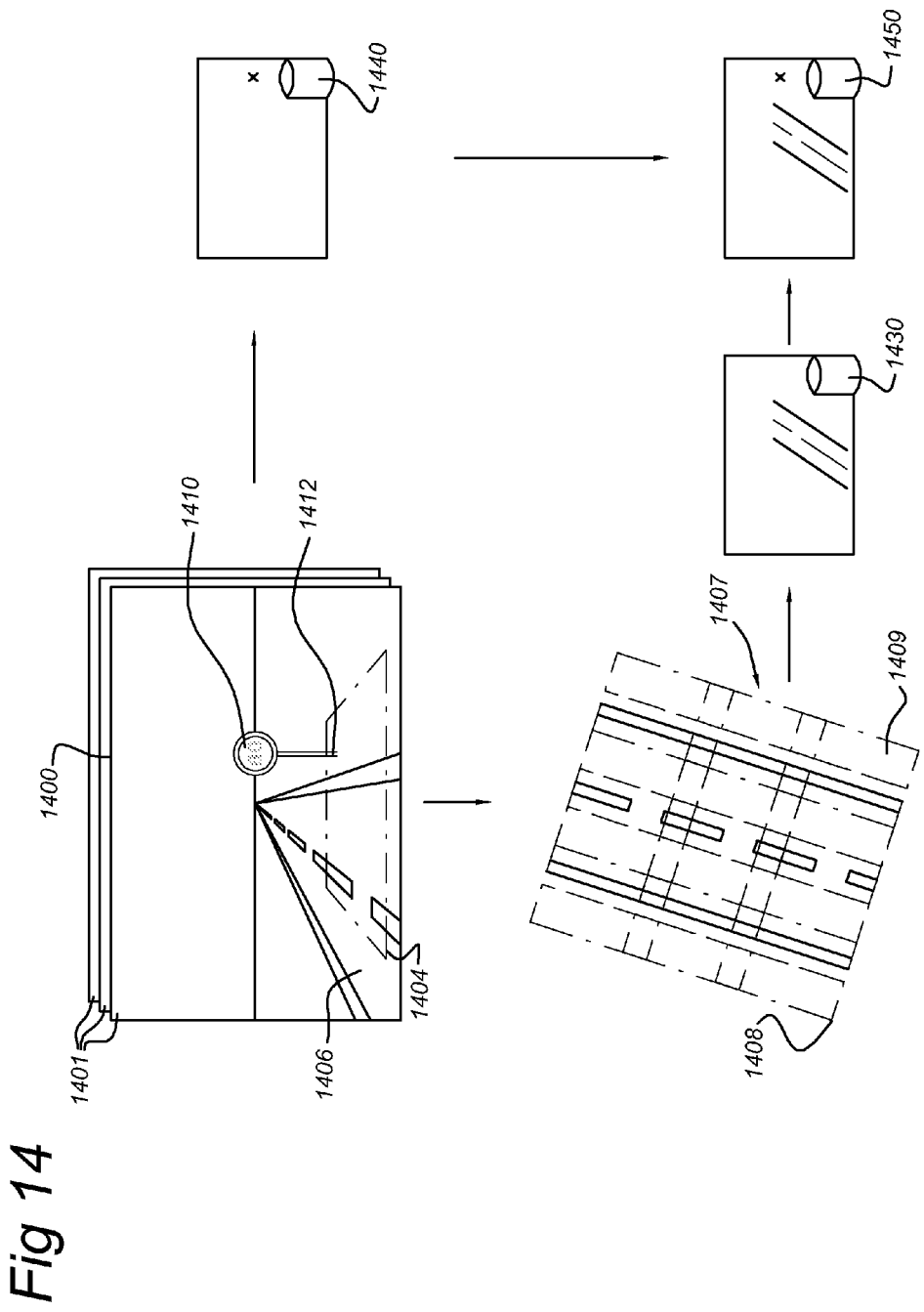
FIG. 14 shows schematically the generation of horizontal information and vertical information.

FIG. 14 shows a sequence of source images 1401, obtained by a terrestrial based camera. Source image 1400 comprises both horizontal information and vertical signage information. Below the sequence of source images 1401 the associated orthorectified mosaic 1407 is shown. The dashed trapezoid 1404 in the image 1400 indicates the corresponding border of the orthorectified tile 1409. The horizontal information in the source images corresponds to the road surface 1406, having a centerline and border lines. The vertical signage information in the source image 1400 corresponds to a road sign 1410 indicating a speed limit of 80 km/h. The method according to the invention is used to obtain the orthorectified tile 1409. The orthorectified tile 1409 has associated position information to enable an engineer to determine for each pixel corresponding relative and/or absolute position coordinates in a coordinate reference system.

Orthorectified mosaic 1407 has been obtained by processing orthorectified tile 1409 and orthorectified tiles generated from the other source images. Furthermore, associated position information is generated to enable an engineer to determine for each pixel of the orthorectified mosaic 1407 the corresponding relative and/or absolute position coordinates. The associated position information could be defined by the geo-position of all the corners of the orthorectified mosaic 1407. In another embodiment the associated position information could be defined by the horizontal and vertical resolution of the image with respect to the geo-position of a predefined reference pixel 1408 of the orthorectified mosaic 1407 and orientation of the orthorectified mosaic with respect to a predefined reference orientation axis (not indicated).

Horizontal road information is extracted from the orthorectified mosaic 1407, and the associated position is determined relative to the reference position of the orthorectified mosaic 1407. In an embodiment the extracted horizontal information is stored as lines. The extracted horizontal information could be stored in a temporary database 1430.

Road sign can be detected in manual or automatic manner. After a road sign 1410 has been detected, position of it could identified by well known photogrametrical methods from pair of images in which the signage is visible. A pair of images enables the engineer to determine the position if the road sign is not visibly in a source image attached to the ground by a structure, e.g. pole, building wall. If the road sign is visibly attached to the ground by e.g. a pole, the pixels in the source image where the pole touches the ground could be used to determine accurately the position of the sign post in the geographic coordinate reference system. Furthermore, standardized characteristic of road signs could be used to determine the position of the road sign. For example, the size of the road sign in the image could be used to determine the distance between camera and the road sign. The position can be relative to the reference position of the orthorectified tile, or relative to the position of horizontal information in the source image, such as a particular position of the centerline. In an embodiment the extracted signage information is stored as a point with corresponding signage type indicator. The signage type indicator could be a pointer to a database comprising the graphical representation of road signs, wherein the pointer refers to the detected type of road sign. The extracted vertical signage information could be stored in a temporary signage database 1440.

The extracted horizontal road information and associated position data and extracted vertical signage information and associated position data could finally be stored in a digital map database 1450. The horizontal road information and vertical signage information and their respective position data can be used in a navigation systems to produce a graphical representation of the road including the horizontal road information and vertical signage information. As both horizontal road information and vertical signage information are retrieved from the same data source, a sequence of source images obtained by means of a terrestrial based camera, the relative positions of the two types of information with respect to each other is very accurately.

The description given above assumes that the horizontal information to be captured extends to more than one source image. It should be clear that for horizontal information that is visible in one source image, no orthorectified mosaic has to be generated to obtain the position in the geographic coordinate reference system. Therefore, a source image comprising entirely the horizontal information and vertical information could be used to determine accurately the position of both the horizontal and vertical information. The x,y position of the pixel of the attachment point where the vertical information touches the ground (=virtual horizontal plane) in the source image is converted to an x.y position in the orthorectified image. The metadata of the orthorectified image enables us to calculate the corresponding geo-position.

Figure 9:
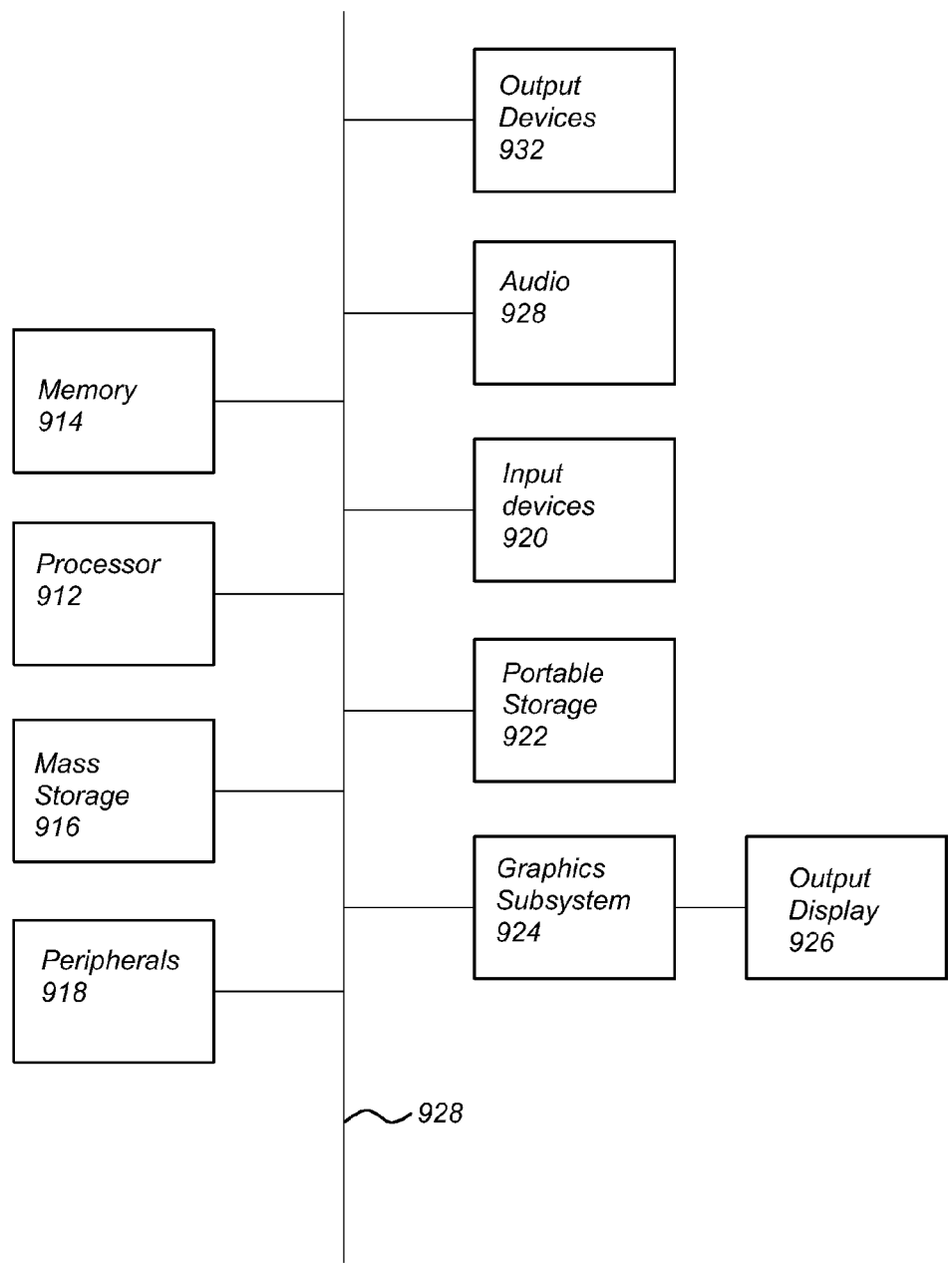
FIG. 9 is a block diagram of an exemplar hardware system for implementing an orthorectified mosaic generator.

FIG. 9 illustrates a high level block diagram of a computer system which can be used to implement an orthorectified mosaic generator performing the method described above.

The computer system of FIG. 9 includes a processor unit 912 and main memory 914. Processor unit 912 may contain a single microprocessor, or may contain a plurality of microprocessors for configuring the computer system as a multi-processor system. Main memory 914 stores, in part, instructions and data for execution by processor unit 912. If the method of the present invention is wholly or partially implemented in software, main memory 914 stores the executable code when in operation. Main memory 914 may include banks of dynamic random access memory (DRAM) as well as high speed cache memory.

The system of FIG. 9 further includes a mass storage device 916, peripheral device(s) 918, input device(s) 920, portable storage medium drive(s) 922, a graphics subsystem 924 and an output display 926. For purposes of simplicity, the components shown in FIG. 9 are depicted as being connected via a single bus 928. However, the components may be connected through one or more data transport means. For example, processor unit 912 and main memory 914 may be connected via a local microprocessor bus, and the mass storage device 916, peripheral device(s) 918, portable storage medium drive(s) 922, and graphics subsystem 924 may be connected via one or more input/output (I/O) buses. Mass storage device 916, which may be implemented with a magnetic disk drive or an optical disk drive, is a non-volatile storage device for storing data, such as the geo-coded image sequences of the respective cameras, calibration information of the cameras, constant and variable position parameters, constant and variable orientation parameters, the orthorectified tiles and orthorectified mosaics, and instructions for use by processor unit 912. In one embodiment, mass storage device 916 stores the system software or computer program for implementing the present invention for purposes of loading to main memory 914.

Portable storage medium drive 922 operates in conjunction with a portable non-volatile storage medium, such as a floppy disk, micro drive and flash memory, to input and output data and code to and from the computer system of FIG. 9. In one embodiment, the system software for implementing the present invention is stored on a processor readable medium in the form of such a portable medium, and is input to the computer system via the portable storage medium drive 922. Peripheral device(s) 918 may include any type of computer support device, such as an input/output (I/O) interface, to add additional functionality to the computer system. For example, peripheral device(s) 918 may include a network interface card for interfacing computer system to a network, a modem, etc.

Input device(s) 920 provide a portion of a user interface. Input device(s) 920 may include an alpha-numeric keypad for inputting alpha-numeric and other key information, or a pointing device, such as a mouse, a trackball, stylus, or cursor direction keys. In order to display textual and graphical information, the computer system of FIG. 9 includes graphics subsystem 924 and output display 926.

Output display 926 may include a cathode ray tube (CRT) display, liquid crystal display (LCD) or other suitable display device. Graphics subsystem 924 receives textual and graphical information, and processes the information for output to display 926. Output display 926 can be used to report the results of a path finding determination, display an orthorectified mosaic, display directions, display confirming information and/or display other information that is part of a user interface. The system of FIG. 9 also includes an audio system 928, which includes a microphone. In one embodiment, audio system 928 includes a sound card that receives audio signals from the microphone. Additionally, the system of FIG. 9 includes output devices 932. Examples of suitable output devices include speakers, printers, etc.

The components contained in the computer system of FIG. 9 are those typically found in general purpose computer systems, and are intended to represent a broad category of such computer components that are well known in the art.

Thus, the computer system of FIG. 9 can be a personal computer, workstation, minicomputer, mainframe computer, etc. The computer can also include different bus configurations, networked platforms, multi-processor platforms, etc. Various operating systems can be used including UNIX, Solaris, Linux, Windows, Macintosh OS, and other suitable operating systems.

The method described above could be performed automatically. It might happen that the images are such that image processing tools and object recognition tools need some correction. For example the superimposing of an orthorectified tile on the other orthorectified tiles or partially generated orthorectified mosaic could result in undesired visible distortions in an orthorectified mosaic. In that case the method includes some verification and manual adaptation actions to enable the possibility to confirm or adapt intermediate results. These actions could also be suitable for accepting intermediate results or the final result of the orthorectified mosaic generation.

The foregoing detailed description of the invention has been presented for purposes of illustration and description. It is not intended to be exhaustive or to limit the invention to the precise form disclosed, and obviously many modifications and variations are possible in light of the above teaching. For example, the invention is also suitable to determine accurately the position of any kind of objects detectable in the source images. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. Method for generating a geo-positioned orthorectified tile, comprising:

retrieving a sequence of source images obtained at different times by a terrestrial based camera mounted on a moving vehicle when driving across a road surface;

retrieving position data associated with each of the retrieved source images and representative of the position of the vehicle in a geographic coordinate reference system, wherein the position data includes constant position parameters defining the position of the camera with respect to a reference position within the vehicle and variable position parameters defining the position of the vehicle's reference position in said geographical coordinate reference system;

retrieving orientation data associated with each of the retrieved source images and representative of the orientation of the vehicle within the geographic coordinate reference system, wherein the orientation data includes constant orientation parameters defining the orientation of the camera with respect to a reference orientation of the vehicle and variable orientation parameters defining the orientation of the vehicle's reference orientation in said geographic coordinate reference system;

using the position and orientation data associated with the retrieved source images to determine the position and orientation of the road surface below the vehicle at the time each source image is obtained;

estimating the plane of the road surface seen in a first source image using the position and orientation of the road surface below the vehicle determined from a second source image in which the vehicle is positioned over the road surface seen in the first image; and converting the first source image using the estimated plane of the road surface seen in the first source image and an angle defined by a difference in elevation between two sides of the road surface with respect to a horizontal plane to obtain the geo-positioned orthorectified tile and corresponding metadata defining a conversion of pixel coordinates in the geo-positioned orthorectified tile to a position in the geographic coordinate reference system.

2. Method according to claim 1, wherein the geo-positioned orthorectified tile comprises pixels, and said converting includes:
determining at least one pixel in the source image corresponding to a pixel of the geo-positioned orthorectified tile; and
determining the value of the pixel of the geo-positioned orthorectified tile from the values of the at least one pixel in the source image.

3. Method according to claim 2, wherein a shape of the geo-positioned orthorectified tile is a rectangle.

4. Method according to claim 2, wherein determining the value of the pixel of the geo-positioned orthorectified tile from the values of at least one pixel in the corresponding source image includes at least one of averaging and interpolating the values of a plurality of neighboring pixels of a corresponding pixel in the corresponding source image.

5. Method according to claim 1, wherein a shape of the geo-positioned orthorectified tile is a rectangle.

6. Method according to claim 1, wherein the converting includes:
correcting geometric distortion in the source image;
performing a 90 degree rotation over a focal point of the camera to obtain a geo-positioned orthorectified image, the orthorectified image being perpendicular to the plane of the geographic reference.

7. Method for generating a geo-positioned orthorectified mosaic, comprising:
generating geo-positioned orthorectified tiles from source images obtained by a terrestrial based camera mounted on a moving vehicle when driving across a road surface by the method according to claim 1; and
generating the geo-positioned orthorectified mosaic and metadata from the generated geo-positioned orthorectified tiles and corresponding metadata.

8. Method according to claim 7, wherein generating of the geo-positioned orthorectified mosaic includes:
defining a projected coordinate reference system for the geo-positioned orthorectified mosaic from the position data;
determining an area of geo-positioned orthorectified tile in the geo-positioned orthorectified mosaic by way of the projected coordinate reference system and metadata corresponding to the geo-positioned orthorectified tile; and
converting pixels of the determined area of the geo-positioned orthorectified tile into pixels of the geo-positioned orthorectified mosaic.

9. A non-transitory processor readable storage medium carrying a geo-positioned orthorectified mosaic obtained by the method according to claim 7.

10. A non-transitory processor readable medium carrying a computer program product which, when loaded on a computer arrangement, allows the computer arrangement to perform the method according to claim 1.

11. The method of claim 1 wherein the variable orientation parameters comprise pitch and roll of the vehicle measured at the time when the source images are retrieved.

12. The method of claim 1, wherein the first source image is an intermediate image.

13. The method of claim 12, wherein the first source image is 3D processed.

14. The method of claim 1 wherein the orthorectified tile is a scaled version of an orthorectified view.

15. The method of claim 1, wherein the metadata comprises geo-reference data corresponding to an image describing a one-to-one relationship from an image coordinate system to the geographic coordinate reference system.

16. A computer arrangement comprising:
an input device;
a processor readable storage medium;
a processor in communication with said input device and said processor readable storage medium; and
an output device in communication with the processor, said processor readable storage medium storing code to program said processor to perform a method comprising
retrieving a sequence of source images obtained at different times by a terrestrial based camera mounted on a moving vehicle when driving across a road surface;
retrieving position data associated with each of the retrieved source images and representative of the position of the vehicle in a geographic coordinate reference system, wherein the position data includes constant position parameters defining the position of the camera with respect to a reference position within the vehicle and variable position parameters defining the position of the vehicle's reference position in the geographical coordinate reference system;
retrieving orientation data associated with each of the retrieved source images and representative of the orientation of the vehicle in the geographic coordinate reference system, wherein the orientation data include constant orientation parameters defining the orientation of the camera with respect to a reference orientation of the vehicle and variable orientation parameters defining the orientation of the vehicle's reference orientation in said geographic coordinate reference system;
using the position of and orientation data associated with the retrieved source images to determine the position and orientation of the road surface below the vehicle at the time each source image is obtained;
estimating the plane of the road surface seen in each source image using the position and orientation of the road surface below the vehicle determined from another source image in which the vehicle is positioned over the road surface seen in each image;
converting each source image using the estimated plane of the road surface seen in each source image and an angle defined by a difference in elevation between two sides of the road surface with respect to a horizontal plane to obtain a geo-positioned orthorectified tile and corresponding metadata defining a conversion of pixel coordinates in the geo-positioned orthorectified tile to a position in the geographic coordinate reference system;
generating an geo-positioned orthorectified mosaic and corresponding metadata from the obtained geo-positioned orthorectified tiles; and
storing the orthorectified mosaic and associated metadata on the processor readable storage medium.

* * * * *